US012628591B2

(12) United States Patent
Matsui

(10) Patent No.: US 12,628,591 B2
(45) Date of Patent: *May 12, 2026

(54) ETCHING METHOD AND METHOD FOR PRODUCING SEMICONDUCTOR ELEMENT

(71) Applicant: Resonac Corporation, Tokyo (JP)

(72) Inventor: Kazuma Matsui, Tokyo (JP)

(73) Assignee: Resonac Corporation, Tokyo (JP)

( * ) Notice: Subject to any disclaimer, the term of this patent is extended or adjusted under 35 U.S.C. 154(b) by 151 days.

This patent is subject to a terminal disclaimer.

(21) Appl. No.: 18/562,082

(22) PCT Filed: Mar. 30, 2022

(86) PCT No.: PCT/JP2022/016207
§ 371 (c)(1),
(2) Date: Nov. 17, 2023

(87) PCT Pub. No.: WO2022/244519
PCT Pub. Date: Nov. 24, 2022

(65) Prior Publication Data
US 2024/0249952 A1      Jul. 25, 2024

(30) Foreign Application Priority Data

May 20, 2021    (JP) ................................. 2021-085388

(51) Int. Cl.
*H01L 21/311* (2006.01)
*H01L 21/3065* (2006.01)
*C09K 13/08* (2006.01)
(52) U.S. Cl.
CPC .... *H01L 21/31116* (2013.01); *H01L 21/3065* (2013.01); *C09K 13/08* (2013.01)

(58) Field of Classification Search
CPC ........... H01L 21/31116; H01L 21/3065; H01L 31/31144; H01L 31/302; H01L 21/31144; H01L 21/302; C09K 13/08
See application file for complete search history.

(56) References Cited

U.S. PATENT DOCUMENTS

| | | | | |
|---|---|---|---|---|
| 4,356,252 A | * | 10/1982 | Lee ........................... | G03F 7/28 |
| | | | | 430/908 |
| 10,529,581 B2 | | 1/2020 | Hsu et al. | |
| 2005/0082002 A1 | | 4/2005 | Sato et al. | |

(Continued)

FOREIGN PATENT DOCUMENTS

| | | |
|---|---|---|
| JP | 2005-101583 A | 4/2005 |
| JP | 2021-509538 A | 3/2021 |

(Continued)

*Primary Examiner* — Anita K Alanko
(74) *Attorney, Agent, or Firm* — Sughrue Mion, PLLC

(57) ABSTRACT

Provided is an etching method capable of selectively etching an etching object containing silicon nitride as compared with a non-etching object while the generation of particles and a variation in etching rate are suppressed. The etching method includes an etching step of bringing an etching gas containing more than 20% by volume of nitrosyl fluoride into contact with a member to be etched (12) having an etching object that is to be etched by the etching gas and having a non-etching object that is not to be etched by the etching gas, to selectively etch the etching object as compared with the non-etching object without plasma. The etching object contains silicon nitride.

11 Claims, 2 Drawing Sheets

(56)  References Cited

U.S. PATENT DOCUMENTS

| | | | | |
|---|---|---|---|---|
| 2011/0259370 A1* | 10/2011 | Kameda | ............ | H01L 21/02271 |
| | | | | 134/166 R |
| 2014/0248783 A1* | 9/2014 | Kameda | .............. | C23C 16/4405 |
| | | | | 438/758 |
| 2014/0357085 A1* | 12/2014 | Moriya | ............... | H01L 21/3065 |
| | | | | 156/345.24 |
| 2016/0181116 A1 | 6/2016 | Berry, III et al. | | |
| 2019/0206696 A1 | 7/2019 | Hsu et al. | | |
| 2023/0395389 A1* | 12/2023 | Iwasaki | .............. | H01L 21/3065 |
| 2024/0153778 A1* | 5/2024 | Iwasaki | .................. | C09K 13/00 |
| 2024/0282593 A1* | 8/2024 | Nakano | ............... | H10D 30/668 |
| 2024/0363356 A1* | 10/2024 | Matsui | .................. | H01L 21/302 |

FOREIGN PATENT DOCUMENTS

| | | | | |
|---|---|---|---|---|
| TW | 201931468 A | 8/2019 | | |
| WO | WO-2008117258 A2 * | 10/2008 | ............. | C23C 16/54 |

* cited by examiner

FIG. 2

ETCHING METHOD AND METHOD FOR PRODUCING SEMICONDUCTOR ELEMENT

CROSS REFERENCE TO RELATED APPLICATIONS

This application is a National Stage of International Application No. PCT/JP2022/016207 filed Mar. 30, 2022, claiming priority based on Japanese Patent Application No. 2021-085388 filed May 20, 2021.

TECHNICAL FIELD

The present invention relates to an etching method and a method for producing a semiconductor element.

BACKGROUND ART

Nitrosyl fluoride (NOF) is usable as an etching gas for etching a silicon material in a semiconductor production process. For example, PTL 1 discloses a method of selectively etching silicon nitride as compared with silicon oxide by using an etching gas containing nitrosyl fluoride at a concentration of 0.1 to 20% by volume. In the method, silicon nitride is an etching object that is to be etched by the etching gas, whereas silicon oxide is a non-etching object that is not to be etched by the etching gas.

CITATION LIST

Patent Literature

PTL 1: U.S. Ser. No. 10/529,581 B

SUMMARY OF INVENTION

Technical Problem

When an etching gas containing nitrosyl fluoride at a low concentration is used to perform etching, the etching is required to be performed at a high temperature in order to increase the ratio of the etching rate of silicon nitride to the etching rate of silicon oxide or the etching selectivity.

At a higher etching temperature, however, it becomes difficult to uniformly maintain the temperature of a member to be etched having an etching object and a non-etching object or the temperature of an etching gas during etching, and this may vary the etching rate of an etching object.

In addition, at a high etching temperature, members included in an etching system may be worn or a member to be etched may be excessively etched, and this may generate particles. When the generated particles adhere to a member to be etched, structural collapse or short-circuit of the member to be etched may be caused, and this may reduce the production yield of semiconductor elements.

The present invention is intended to provide an etching method capable of selectively etching an etching object containing silicon nitride as compared with a non-etching object while the generation of particles and a variation in etching rate are suppressed and to provide a method for producing a semiconductor element.

Solution to Problem

To solve the problems, aspects of the present invention are the following [1] to [7].

[1] An etching method including an etching step of bringing an etching gas containing more than 20% by volume of nitrosyl fluoride into contact with a member to be etched having an etching object that is to be etched by the etching gas and having a non-etching object that is not to be etched by the etching gas, to selectively etch the etching object as compared with the non-etching object without plasma, in which the etching object contains silicon nitride.

[2] The etching method according to the aspect [1], in which the etching gas contains nitrosyl fluoride at 30% by volume or more.

[3] The etching method according to the aspect [1] or [2], in which the etching gas is a gas exclusively containing nitrosyl fluoride or a mixed gas containing nitrosyl fluoride and a dilution gas.

[4] The etching method according to any one of the aspects [1] to [3], in which the non-etching object is at least one of silicon oxide and amorphous carbon.

[5] The etching method according to the aspect [4], in which in the etching step, the temperature condition is 50° C. or more and 250° C. or less.

[6] The etching method according to any one of the aspects [1] to [5], in which the etching selectivity that is the ratio of the etching rate of the etching object to the etching rate of the non-etching object is 10 or more.

[7] A method for producing a semiconductor element, the method using the etching method according to any one of the aspects [1] to [6] to produce a semiconductor element, the member to be etched being a semiconductor substrate having the etching object and the non-etching object, the method including a processing step of removing at least a part of the etching object from the semiconductor substrate by the etching.

Advantageous Effects of Invention

According to the present invention, an etching object containing silicon nitride can be selectively etched as compared with a non-etching object while the generation of particles and a variation in etching rate are suppressed.

BRIEF DESCRIPTION OF DRAWINGS

FIG. 2 is a view illustrating a member to be etched used in Examples and Comparative Examples.

DESCRIPTION OF EMBODIMENTS

Figure 1:
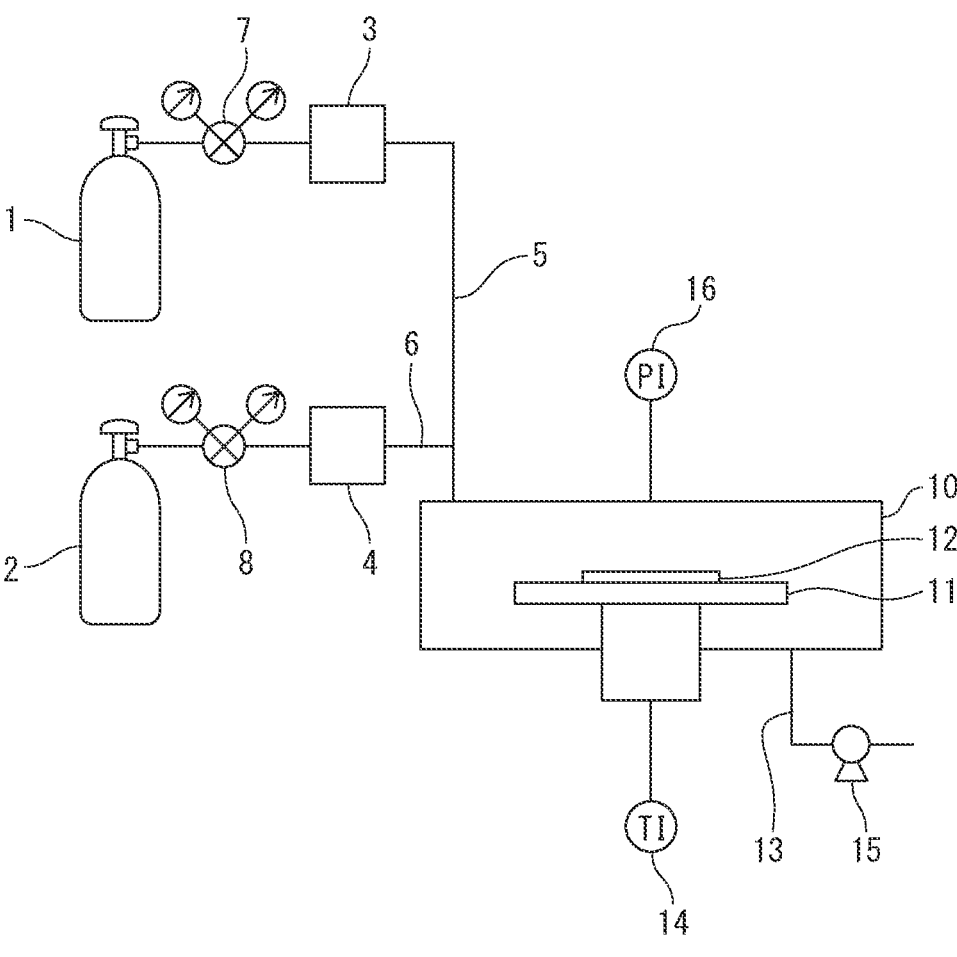
FIG. 1 is a schematic view of an example etching system illustrating an embodiment of an etching method pertaining to the present invention.

Embodiments of the present invention will now be described. The embodiments are merely examples of the present invention, and the present invention is not limited to the embodiments. Various modifications or improvements can be made in the embodiments, and such modifications and improvements can be encompassed by the present invention.

An etching method pertaining to the present embodiment includes an etching step of bringing an etching gas containing more than 20% by volume of nitrosyl fluoride into contact with a member to be etched having an etching object that is to be etched by the etching gas and having a non-etching object that is not to be etched by the etching gas, to selectively etch the etching object as compared with the non-etching object without plasma. In the etching method pertaining to the present embodiment, the etching object contains silicon nitride (SiN).

When the etching gas is brought into contact with a member to be etched, an etching object containing silicon nitride reacts with nitrosyl fluoride in the etching gas, and thus the etching object is etched. In contrast, a non-etching object such as a resist and a mask hardly reacts with nitrosyl fluoride, and thus the non-etching object is hardly etched. By the etching method pertaining to the present embodiment, an etching object can be selectively etched as compared with a non-etching object (i.e., high etching selectivity can be achieved).

For example, the etching selectivity that is the ratio of the etching rate of an etching object to the etching rate of a non-etching object can become 10 or more. The etching selectivity is preferably 30 or more and more preferably 50 or more.

By the etching method pertaining to the present embodiment, an etching object containing silicon nitride can be etched at a high etching rate.

By the etching method pertaining to the present embodiment, an etching object can be etched without plasma, and this eliminates the use of an expensive plasma generator for etching. Accordingly, a member to be etched can be etched at low cost.

By the etching method pertaining to the present embodiment, etching is performed by using an etching gas containing more than 20% by volume of nitrosyl fluoride, and this can improve the etching selectivity even when the etching temperature is not set at a high temperature.

Etching can be performed at a low temperature. Hence, the temperature of a member to be etched or the temperature of an etching gas can be easily uniformly maintained during etching, and the etching rate of an etching object is unlikely to vary.

In addition, etching can be performed at a low temperature, and thus particles are unlikely to be generated during etching. If etching is performed at a high temperature, members included in an etching system may be worn or a member to be etched may be excessively etched, and this may generate particles. By the etching method pertaining to the present embodiment, etching can be performed at a low temperature, and thus particles are unlikely to be generated. Accordingly, when the etching method pertaining to the present embodiment is used to produce a semiconductor element, a smaller number of particles adhere to a member to be etched, and this increases the production yield of the semiconductor element.

In the present invention, "particles" mean small pieces having a major axis length of 1 nm or more and typically mean small pieces having a major axis length of 300 nm or less. Particles satisfying the condition may have any shape and may be, for example, in a granular form, a foil form, a film form, or a massive form.

In the present invention, "etching" means that an etching object of a member to be etched is partially or entirely removed and accordingly the member to be etched is processed into a certain shape (for example, a three-dimensional shape) (for example, a film-shaped etching object composed of silicon nitride of a member to be etched is processed to have a certain film thickness) and also means that residues or deposits of an etching object are removed from a member to be etched for cleaning, for example.

The etching method pertaining to the present embodiment can be used to produce a semiconductor element. In other words, a method for producing a semiconductor element pertaining to the present embodiment is a semiconductor element production method of producing a semiconductor element by using the etching method pertaining to the present embodiment. In the method, the member to be etched is a semiconductor substrate having an etching object and a non-etching object. The method includes a processing step of removing at least a part of the etching object from the semiconductor substrate by the etching.

The etching method pertaining to the present embodiment can be used, for example, to produce a semiconductor element such as a 3D-NAND flash memory. For example, by applying the etching method pertaining to the present embodiment to a laminate in which silicon oxide films and silicon nitride films are alternately stacked and a through-hole extending in the stacking direction and penetrating the laminate is formed (see FIG. 2), the silicon nitride films exposed to the inner face of the through-hole are selectively and isotropically etched, and accordingly a structure in which ends of the silicon oxide films protrude to the through-hole can be formed. A structural body having such a structure can be used as the structural body of a semiconductor element, and thus the process of forming the structural body is used to produce a semiconductor element such as a 3D-NAND flash memory.

A conventional process of forming the structure by etching has been performed by using a drug solution containing phosphoric acid or the like, but etching with an etching gas is superior in microfabrication to etching with a drug solution. Hence, the etching method pertaining to the present embodiment should contribute to further miniaturization and integration of semiconductor elements.

By the etching method pertaining to the present embodiment, etching can be performed at a low temperature, and thus the etching method pertaining to the present embodiment can be used to produce a semiconductor element, for example, having a heat sensitive circuit. For example, when a complementary metal oxide semiconductor (CMOS) or a similar semiconductor is exposed to a high temperature during etching, the circuit may be damaged. When etching is performed by the etching method pertaining to the present embodiment, a circuit is unlikely to be damaged by heat.

When a non-etching object itself is used as the structural body of a semiconductor element, a material that is substantially non-reactive with nitrosyl fluoride or a material that reacts with nitrosyl fluoride extremely slowly is used as the non-etching object. For example, a silicon oxide composed of silicon (Si) and oxygen (O) (specifically including silicon dioxide ($SiO_2$)) or amorphous carbon can be used.

The etching method pertaining to the present embodiment can be used for cleaning as described above. For example, after a step of forming a film of a material containing silicon nitride on a substrate or a step of etching a film of a material containing silicon nitride on a substrate in a chamber, deposits containing silicon nitride adhering onto the inner face of the chamber may be removed by the etching method pertaining to the present embodiment for cleaning. In such cleaning, the chamber corresponds to the member to be etched as a component of the present invention, and the deposits correspond to the etching object as a component of the present invention.

"Particles" and "deposits" will next be described. Particles are mall pieces generated mainly by wear of members included in an etching system and can include small pieces generated by excess etching a member to be etched. Hence, the material of particles is a material used as the material of members included in an etching system or is a material generated during etching by reaction with the material of a member to be etched. Specific examples include oxides, fluorides, oxyfluorides, oxynitrides, and the like of stainless steel, nickel (Ni), alumina ($Al_2O_3$), silicon, yttrium (Y), and the like.

Deposits are the above particles or etching residues adhering in any shape to the side wall of a pattern formed by etching or to the inner face of a chamber, and also includes the above particles. Hence, the material of deposits is a compound of at least one of nitrogen, oxygen, and fluorine with silicon, a material derived from amorphous carbon, or a material generated by wear of members included in an etching system and can include the material of the above particles.

Specific examples of the compound of at least one of nitrogen, oxygen, and fluorine with silicon include a nitride, an oxide, an oxynitride, a fluoronitride, an oxyfluoride, and the like of silicon. Specific example of the material derived from amorphous carbon include amorphous carbon itself and a fluoride, a trinitride, and the like of amorphous carbon. Specific examples of the material generated by wear of members included in an etching system are substantially the same as the particles and include oxides, fluorides, oxyfluorides, oxynitrides, and the like of stainless steel, nickel, alumina, silicon, yttrium, and the like.

The etching method pertaining to the present embodiment will next be described in further detail.

[Etching Gas]

The etching gas is a gas containing nitrosyl fluoride but may be a gas exclusively containing nitrosyl fluoride or a mixed gas containing nitrosyl fluoride and an additional gas. When the etching gas is a mixed gas containing nitrosyl fluoride and an additional gas, the content of nitrosyl fluoride contained in the etching gas is required to be more than 20% by volume, is preferably 30% by volume or more and 90% by volume or less, and is more preferably 30% by volume or more and 70% by volume or less.

When etching is performed with an etching gas containing nitrosyl fluoride at a content within the above range, an etching object containing silicon nitride can be selectively etched as compared with a non-etching object. For example, the etching selectivity that is the ratio of the etching rate of an etching object to the etching rate of a non-etching object can be 10 or more.

As the additional gas contained together with nitrosyl fluoride gas in the etching gas, a dilution gas can be used. In other words, the etching gas can be a mixed gas containing nitrosyl fluoride and a dilution gas.

As the dilution gas, an inert gas is preferred, and specifically at least one selected from nitrogen gas ($N_2$), helium (He), neon (Ne), argon (Ar), krypton (Kr), and xenon (Xe) may be used.

The content of the dilution gas contained in the etching gas is not specifically limited but can be more than 0% by volume and less than 80% by volume.

Each content of fluorine gas ($F_2$) and hydrogen fluoride (HF) contained in the etching gas is preferably 100 ppm by volume or less, more preferably 50 ppm by volume or less, and even more preferably 20 ppm by volume or less. When each content of fluorine gas and hydrogen fluoride is 100 ppm by volume or less, a high etching selectivity is likely to be achieved.

[Pressure Condition in Etching Step]

In the etching method pertaining to the present embodiment, the pressure condition in the etching step is not specifically limited but is preferably 0.1 Pa or more and 80 kPa or less, more preferably 100 Pa or more and 55 kPa or less, and even more preferably 1.3 kPa or more and 40 kPa or less.

For example, a member to be etched may be placed in a chamber, and etching may be performed while an etching gas is allowed to flow through the chamber. When an etching gas is allowed to flow, the pressure in the chamber can be 0.1 Pa or more and 80 kPa or less. The flow rate of an etching gas may be appropriately set so as to maintain a constant pressure in a chamber depending on the chamber size or the performance of an exhaust apparatus that reduces the pressure in the chamber.

[Temperature Condition in Etching Step]

In the etching method pertaining to the present embodiment, the temperature condition in the etching step is not specifically limited but is preferably 50° C. or more and 250° C. or less, more preferably 60° C. or more and 200° C. or less, and even more preferably 70° C. or more and 180° C. or less. When the temperature condition is within the above range, etching can be performed without excessive time or energy, a variation in etching rate can be suppressed, and other advantages are easily achieved. In the description, the temperature of the temperature condition is the temperature of a member to be etched, but the temperature of a stage that is installed in the chamber of an etching system and supports a member to be etched may be used.

Under conditions not generating plasma and conditions at a temperature of 250° C. or less, nitrosyl fluoride hardly reacts with a non-etching object such as silicon oxide and amorphous carbon. Hence, when the etching method pertaining to the present embodiment is used for a member to be etched having both an etching object and a non-etching object, the etching object can be selectively etched while almost no non-etching object is etched. Therefore, the etching method pertaining to the present embodiment can be used as a method for processing an etching object into a certain shape by using a patterned non-etching object as a mask or as a method for removing, from a structural body having an etching object and a non-etching object, the etching object, for example.

In addition, when the temperature of an etching object and a non-etching object is 250° C. or less, a high etching selectivity is likely to be achieved. For example, the etching selectivity that is the ratio of the etching rate of an etching object to the etching rate of a non-etching object is likely to be 10 or more.

[Member to be Etched]

A member to be etched that is to be etched by the etching method pertaining to the present embodiment has an etching object and a non-etching object. The member to be etched may be a member having a portion formed from the etching object and a portion formed from the non-etching object or may be a member formed from a mixture of the etching object and the non-etching object (for example, a member including the non-etching object to which particles of the etching object adheres). The member to be etched may have an additional portion other than the etching object and the non-etching object.

The member to be etched may have any shape and may be, for example, in a plate form, a foil form, a film form, a powder form, or a massive form. Examples of the member to be etched include the semiconductor substrate described above.

[Etching Object]

The etching object contains silicon nitride but may be formed from only silicon nitride, may have a portion formed from only silicon nitride and a portion formed from an additional material, or may be formed from a mixture of silicon nitride and an additional material (for example, an object including an additional material to which silicon nitride particles adhere).

Silicon nitride means a compound that is formed from substantially only silicon and nitrogen and contains silicon and nitrogen at a certain ratio, and examples include $Si_3N_4$. The purity of the silicon nitride is not specifically limited but is preferably 30% by mass or more, more preferably 60% by mass or more, and even more preferably 90% by mass or more.

The etching object may have any shape and may be, for example, in a plate form, a foil form, a powder form, or a massive form.

[Non-Etching Object]

The non-etching object does not substantially react with nitrosyl fluoride or reacts with nitrosyl fluoride extremely slowly. Even when subjected to etching by the etching method pertaining to the present embodiment, the non-etching object is hardly etched. The non-etching object may be any object having the above characteristics, and examples include silicon oxide and amorphous carbon. Examples of the silicon oxide include silicon dioxide ($SiO_2$).

The composition ratio of oxygen atom to silicon atom, O/Si, of the silicon oxide is not specifically limited as long as the silicon oxide does not substantially react with nitrosyl fluoride or reacts with nitrosyl fluoride slower than silicon nitride but is preferably 0.3 or more and 5 or less, more preferably 0.5 or more and 4 or less, even more preferably 1 or more and 3 or less, and particularly preferably 1.2 or more and 2.5 or less.

The non-etching object is hardly etched by the etching method pertaining to the present embodiment, and thus the non-etching object can suppress etching the etching object by an etching gas. Hence, the non-etching object can be used as a resist or a mask for suppressing etching the etching object by an etching gas.

Therefore, the etching method pertaining to the present embodiment can be used, for example, as a method for processing an etching object into a certain shape by using a patterned non-etching object as a resist or a mask (for example, a film shaped etching object of a member to be etched is processed to have a certain film thickness) and thus can be suitably used to produce a semiconductor element.

The non-etching object is hardly etched, and thus the non-etching object can suppress etching a portion that should not be etched in a semiconductor element. This can prevent loss of characteristics of a semiconductor element by etching.

Next, an example structure of an etching system with which the etching method pertaining to the present embodiment can be performed and an example etching method by using the etching system will be described with reference to FIG. 1. The etching system in FIG. 1 is an etching system capable of performing plasmaless etching without plasma. First, the etching system in FIG. 1 will be described.

The etching system in FIG. 1 includes a chamber 10 in which etching is performed, a stage 11 for supporting, in the chamber 10, a member to be etched 12 that is to be etched, a thermometer 14 for determining the temperature of the member to be etched 12, an exhaust pipe 13 for exhausting a gas in the chamber 10, a vacuum pump 15 provided on the exhaust pipe 13 and for reducing the pressure in the chamber 10, and a pressure gauge 16 for determining the pressure in the chamber 10.

The etching system in FIG. 1 also includes an etching gas supply unit for supplying an etching gas into the chamber 10 and an analyzer (not illustrated) for analyzing particles in the chamber 10. The etching gas supply unit includes a nitrosyl fluoride gas supply unit 1 for supplying nitrosyl fluoride gas, a dilution gas supply unit 2 for supplying a dilution gas, a nitrosyl fluoride gas supply pipe 5 connecting the nitrosyl fluoride gas supply unit 1 to the chamber 10, and a dilution gas supply pipe 6 connecting the dilution gas supply unit 2 to the middle of the nitrosyl fluoride gas supply pipe 5.

On the nitrosyl fluoride gas supply pipe 5, a nitrosyl fluoride gas pressure controller 7 for controlling the pressure of nitrosyl fluoride gas and a nitrosyl fluoride gas flow controller 3 for controlling the flow rate of nitrosyl fluoride gas are provided. On the dilution gas supply pipe 6, a dilution gas pressure controller 8 for controlling the pressure of a dilution gas and a dilution gas flow controller 4 for controlling the flow rate of a dilution gas are provided.

When nitrosyl fluoride gas is supplied as the etching gas to the chamber 10, nitrosyl fluoride gas is sent from the nitrosyl fluoride gas supply unit 1 to the nitrosyl fluoride gas supply pipe 5, and accordingly the nitrosyl fluoride gas is supplied through the nitrosyl fluoride gas supply pipe 5 to the chamber 10.

When a mixed gas of nitrosyl fluoride gas with a dilution gas such as an inert gas is supplied as the etching gas, nitrosyl fluoride gas is sent from the nitrosyl fluoride gas supply unit 1 to the nitrosyl fluoride gas supply pipe 5 and the dilution gas is sent from the dilution gas supply unit 2 through the dilution gas supply pipe 6 to the nitrosyl fluoride gas supply pipe 5. Accordingly, the nitrosyl fluoride gas and the dilution gas are mixed to form a mixed gas at the middle of the nitrosyl fluoride gas supply pipe 5, and the mixed gas is supplied through the nitrosyl fluoride gas supply pipe 5 to the chamber 10. Alternatively, nitrosyl fluoride gas and a dilution gas may be separately supplied to the chamber 10 and be mixed in the chamber 10 to form a mixed gas.

The nitrosyl fluoride gas supply unit 1 and the dilution gas supply unit 2 may have any structure, which may be, for example, a tank or a cylinder. As the nitrosyl fluoride gas flow controller 3 and the dilution gas flow controller 4, for example, a mass flow controller or a flowmeter may be used.

When an etching gas is supplied to the chamber 10, the gas is preferably supplied while the supply pressure of the etching gas (i.e., the value of the nitrosyl fluoride gas pressure controller 7 in FIG. 1) is maintained at a certain value. In other words, the supply pressure of an etching gas is preferably 20 kPa or more and 1,500 kPa or less, more preferably 40 kPa or more and 700 kPa or less, and even more preferably 60 kPa or more and 400 kPa or less. When the supply pressure of an etching gas is within the above range, the etching gas is smoothly supplied to the chamber 10, and a small load is applied on parts of the etching system in FIG. 1 (for example, the various units and tubes described above).

The pressure of the etching gas supplied into the chamber 10 is preferably 0.1 Pa or more and 80 kPa or less, more preferably 100 Pa or more and 55 kPa or less, and even more preferably 1.3 kPa or more and 40 kPa or less. When the pressure of the etching gas in the chamber 10 is within the above range, a sufficient etching rate is achieved, and a high etching selectivity is likely to be achieved.

The pressure in the chamber 10 before supplying an etching gas may be any value that is not more than the supply pressure of the etching gas or is lower than the supply pressure of the etching gas but, for example, is preferably not less than 0.1 Pa and less than 40 kPa and more preferably 10 Pa or more and 20 kPa or less.

The difference between the supply pressure of an etching gas and the pressure in the chamber 10 before supplying the etching gas is preferably 1.5 MPa or less, more preferably 0.6 MPa or less, and even more preferably 0.4 MPa or less. When the difference is within the above range, an etching gas is likely to be smoothly supplied to the chamber 10.

When an etching gas is supplied to the chamber 10, the etching gas is preferably supplied while maintained to have a certain temperature. In other words, the supply temperature of an etching gas is preferably 0° C. or more and 250° C. or less.

During etching, the temperature of a member to be etched 12 is preferably 250° C. or less. Within the temperature range, an etching object of a member to be etched 12 is smoothly etched. In addition, a small load is applied to the etching system, and the etching system is likely to have a longer service life.

The processing time of etching (hereinafter also called "etching time") can be appropriately set depending on an intended etching degree of an etching object of a member to be etched 12 but is preferably within 180 minutes, more preferably within 140 minutes, even more preferably within 90 minutes, and particularly preferably within 60 minutes in consideration of production efficiency of a semiconductor element production process. The processing time of etching means a time from the introduction of an etching gas into the chamber 10 to the exhaust of the etching gas in the chamber 10 to complete the etching.

The etching method pertaining to the present embodiment can be performed by using a typical etching system used in a semiconductor element production process, such as the etching system in FIG. 1, and the usable etching system may have any structure.

For example, the positional relation between the nitrosyl fluoride gas supply pipe 5 and the member to be etched 12 is not specifically limited as long as an etching gas can be brought into contact with the member to be etched 12. The temperature control mechanism of the chamber 10 may have any structure that can control a member to be etched 12 to have an intended temperature. Hence, a temperature control mechanism for a member to be etched 12 may be directly installed on the stage 11, or an external temperature controller may be installed to heat or cool the chamber 10 from the outside of the chamber 10.

The etching system in FIG. 1 may be formed from any material that has corrosion resistance against nitrosyl fluoride and can withstand an intended reduced pressure. For example, a part to come into contact with an etching gas may be formed from a metal such as nickel, a nickel-based alloy, aluminum (Al), stainless steel, and platinum (Pt), a ceramic such as alumina, a fluorine resin, or a similar material.

Specific examples of the nickel-based alloy include Inconel (registered trademark), Hastelloy (registered trademark), and Monel (registered trademark). Examples of the fluorine resin include polytetrafluoroethylene (PTFE), polychlorotrifluoroethylene (PCTFE), tetrafluoroethylene-perfluoroalkoxyethylene copolymer (PFA), polyvinylidene fluoride (PVDF), Viton (registered trademark), and Kalrez (registered trademark).

EXAMPLES

The present invention will next be described in further detail with reference to Examples and Comparative Examples.

Example 1

An etching system having substantially the same structure as the etching system in FIG. 1 was used to etch samples to be etched. The samples to be etched used in Example 1 will be described. A sample in which a silicon nitride film having a film thickness of 1,000 nm was formed on the surface of a disk-shaped silicon wafer having a diameter of 100 mm (manufactured by SEIREN KST), a sample in which a silicon oxide film having a film thickness of 1,000 nm was formed on the surface of a disk-shaped silicon wafer having a diameter of 100 mm (manufactured by SEIREN KST), and a sample in which an amorphous carbon film having a film thickness of 1,500 nm was formed on the surface of a disk-shaped silicon wafer having a diameter of 100 mm (manufactured by SEIREN KST) were prepared.

These three samples to be etched were arranged on the stage in the chamber of the etching system, and the temperature of the stage was increased to 150° C. Next, nitrosyl fluoride gas at a flow rate of 30 mL/min and argon at a flow rate of 60 mL/min were mixed to prepare a mixed gas, and the mixed gas was used as the etching gas. The etching gas was then supplied into the chamber at a flow rate of 90 mL/min and was allowed to flow for 10 minutes to perform etching. When the etching gas was allowed to flow, the pressure in the chamber was 6.7 kPa, and the partial pressure of the nitrosyl fluoride gas was 2.2 kPa.

Accordingly, the silicon nitride film, the silicon oxide film, and the amorphous carbon film of the three samples to be etched were etched. After completion of the etching gas flowing, the heating of the stage was stopped, and the inside of the chamber was replaced with argon.

The content of hydrogen fluoride contained in the etching gas was determined by using an infrared spectrophotometer, Nicolet iS5 manufactured by Thermo Fisher Scientific to be less than 20 ppm by volume. The measurement conditions were as described below.

Measurement temperature: 60° C.

Measurement pressure: 0.1 MPa

Window material: calcium fluoride

Times of integration: 8

Measurement wavelength region: 1,200 to 4,000 cm$^{-1}$

Wavelength of peak used for measurement: 3,877 cm$^{-1}$

After completion of the etching, the chamber was opened, and the samples to be etched were taken out. Each film thickness of the silicon nitride film, the silicon oxide film, and the amorphous carbon film was determined, and the number of particles adhering to each surface of the silicon nitride film, the silicon oxide film, and the amorphous carbon film was counted.

Each film thickness of the silicon nitride film, the silicon oxide film, and the amorphous carbon film was determined by using F20 film thickness measurement system manufactured by Filmetrics. The film thickness measurement conditions were as described below.

Measurement pressure: atmospheric pressure (101.3 kPa)

Measurement temperature: 28° C.

Measurement atmosphere: the atmosphere

Measurement wavelength region for silicon nitride: 900 to 1,700 nm

Measurement wavelength region for silicon oxide: 200 to 1,000 nm

Measurement wavelength region for amorphous carbon: 800 to 1,200 nm

For each of the silicon nitride film, the silicon oxide film, and the amorphous carbon film, the film thickness (unit: nm) after etching was subtracted from the film thickness (unit: nm) before etching, and the difference was divided by the etching time (unit: min) to calculate each etching rate (unit: nm/min) of the silicon nitride, the silicon oxide, and the amorphous carbon. The ratio of the etching rate of the etching object (silicon nitride) to the etching rate of the non-etching object (silicon oxide or amorphous carbon) was calculated (etching selectivity). The results are shown in Table 1.

For each of the silicon nitride film, the silicon oxide film, and the amorphous carbon film, the number of particles adhering to the surface was counted by using Wafer Surface Analyzer WM-2500 manufactured by Topcon. As a result, no particle was detected on each film. The total number of particles adhering to each surface of the three films is shown in Table 1.

The member to be etched was placed on a stage of an etching system having substantially the same structure as the etching system in FIG. 1, and the stage temperature was set at 150° C. Next, nitrosyl fluoride gas at a flow rate of 35 mL/min and argon at a flow rate of 65 mL/min were mixed to prepare a mixed gas, and the mixed gas was used as the etching gas. The etching gas was then supplied into the chamber and was allowed to flow for 10 minutes to perform etching. When the etching gas was allowed to flow, the pressure in the chamber was 6.7 kPa. After completion of the

TABLE 1

| | Etching gas | | | | | Etching rate (nm/min) | | | Etching selectivity | | The number |
|---|---|---|---|---|---|---|---|---|---|---|---|
| | Com-position | Flow rate*) | NOF content (% by volume) | Stage temper-ature (° C.) | Pressure in chamber (kPa) | Silicon nitride | Silicon oxide | Amor-phous carbon | Ratio to silicon oxide | Ratio to amorphous carbon | of particles (pieces) |
| Ex. 1 | NOF/Ar | 30/60 | 33.3 | 150 | 6.7 | 25 | less than 0.1 | less than 0.1 | more than 250 | more than 250 | 0 |
| Ex. 2 | NOF/Ar | 45/45 | 50.0 | 150 | 6.7 | 67 | less than 0.1 | less than 0.1 | more than 670 | more than 670 | 1 |
| Ex. 3 | NOF/A | 60/30 | 66.7 | 150 | 6.7 | 76 | less than 0.1 | less than 0.1 | more than 760 | more than 760 | 3 |
| Ex. 4 | NOF/Ar | 45/45 | 50.0 | 150 | 20.1 | 49 | less than 0.1 | less than 0.1 | more than 490 | more than 490 | 0 |
| Ex. 5 | NOF/Ar | 45/45 | 50.0 | 80 | 6.7 | 10 | less than 0.1 | less than 0.1 | more than 100 | more than 100 | 0 |
| Ex. 6 | NOF/Ar | 45/45 | 50.0 | 200 | 6.7 | 73 | less than 0.1 | less than 0.1 | more than 730 | more than 730 | 4 |
| Ex. 7 | NOF/Ar | 45/45 | 50.0 | 50 | 6.7 | 3 | 0.1 | less than 0.1 | 30 | more than 30 | 0 |
| Ex. 8 | NOF/Ar | 81/8 | 91.0 | 150 | 6.7 | 62 | 1 | 2 | 62 | 31 | 14 |
| Comp. Ex. 1 | NOF/Ar | 9/81 | 10.0 | 350 | 6.7 | 15 | 0.1 | 0.2 | 150 | 75 | 21 |
| Comp. Ex. 2 | NOF/Ar | 9/81 | 10.0 | 150 | 6.7 | 5 | 1 | less than 0.1 | 5 | more than 50 | 3 |

*)The flow rate of nitrosyl fluoride (NOF) gas and a dilution gas (Ar): for example, expressed as 30/60 when the flow rate of nitrosyl fluoride gas is 30 mL/min and the flow rate a dilution gas is 60 mL/min.

Examples 2 to 8 and Comparative Examples 1 and 2

Three samples to be etched were etched in the same manner as in Example 1 except that the flow rates of nitrosyl fluoride gas and argon, the stage temperature, and the pressure in the chamber were set as shown in Table 1, and each etching rate of silicon nitride, silicon oxide, and amorphous carbon and the ratios were calculated. The number of particles adhering to each surface of the three films was counted in the same manner as in Example 1, and the total number was calculated. The results are shown in Table 1.

Example 9

Figure 2:
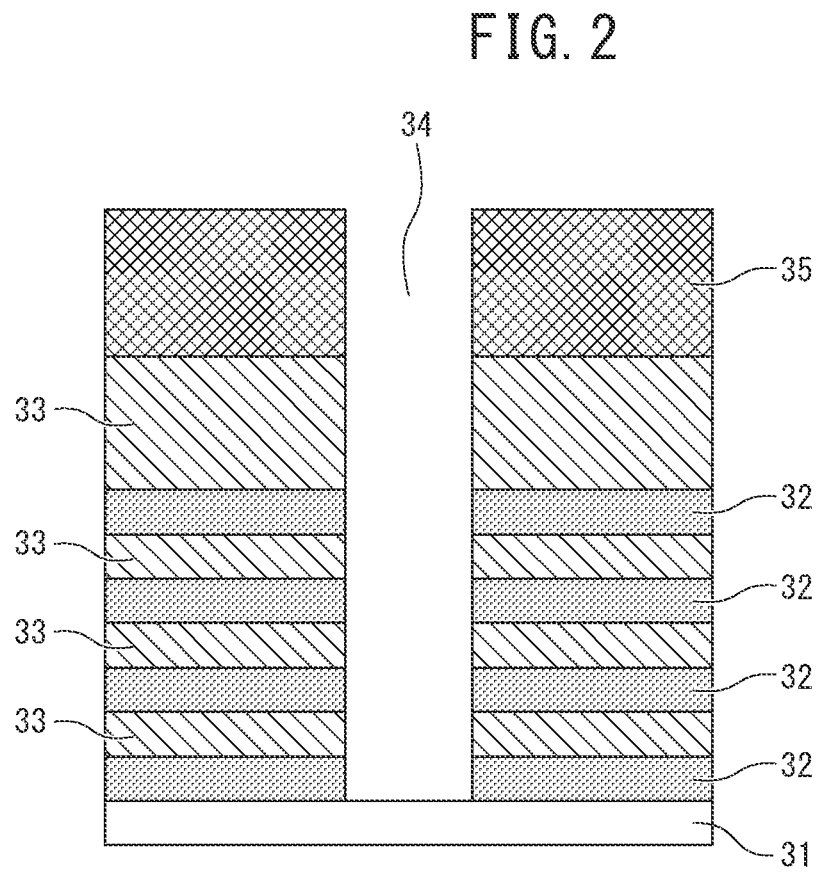

A member to be etched used in Example 9 will be described with reference to FIG. 2. The member to be etched in FIG. 2 had a structure in which 90 silicon nitride films 32 and 90 silicon oxide films 33 are alternately stacked on a silicon substrate 31 (for convenience, FIG. 2 illustrates a structure in which four silicon nitride films and four silicon oxide films are alternately stacked). A single silicon nitride film 32 and a single silicon oxide film 33 each had a film thickness of 35 nm. However, only the uppermost silicon oxide film 33 has a film thickness of 70 nm.

In the structure of the member to be etched in FIG. 2, on the uppermost silicon oxide film 33, an amorphous carbon film 35 having a film thickness of 1,500 nm was further stacked. The silicon nitride films 32 are etching objects, and the silicon oxide films 33 and the amorphous carbon film 35 are non-etching objects. The member to be etched in FIG. 2 had a through-hole 34 that had a diameter of 200 nm and penetrated the 90 silicon nitride films 32, the 90 silicon oxide films 33, and the single amorphous carbon film 35 in the stacking direction.

etching gas flowing, the heating of the stage was stopped, and the inside of the chamber was replaced with argon.

The chamber was opened, and the member to be etched was taken out. In the member to be etched after etching, a portion of the silicon nitride film 32 exposed to the inner face of the through-hole 34 was etched, and the silicon nitride film 32 was especially preferentially etched as compared with the silicon oxide film 33. Accordingly, the inner face of the through-hole 34 was partially expanded outward in the radial direction.

A portion of the silicon oxide film 33 exposed to the inner face of the through-hole 34 was unlikely to be etched as compared with the silicon nitride film 32, and the amorphous carbon film 35 was hardly etched. Accordingly, a structure in which the ends of the silicon oxide films 33 and the amorphous carbon film 35 protruded in the through-hole 34 was formed.

The taken-out member to be etched was cut, and the cross section of the 90 silicon nitride films 32 and the cross section of the 90 silicon oxide films 33 were analyzed under a transmission electron microscope. Specifically, for each of the 90 silicon nitride films 32, the distance in the radial direction between a portion of the silicon nitride film 32 exposed to the inner face of the through-hole 34 and a portion of the amorphous carbon film 35 exposed to the inner face of the through-hole 34 was determined. For each of the 90 silicon oxide films 33, the distance in the radial direction between a portion of the silicon oxide film 33 exposed to the inner face of the through-hole 34 and a portion of the amorphous carbon film 35 exposed to the inner face of the through-hole 34 was determined.

In other words, etching expanded the inner face of the through-hole 34 outward in the radial direction to increase the radius of the through-hole 34, and the difference in radius was determined. The difference was then divided by the etching time to calculate the relative etching rate of silicon nitride to amorphous carbon and the relative etching rate of silicon oxide to amorphous carbon. The etching rate of amorphous carbon was calculated by comparing the diameters of the through-hole 34 before and after the etching, but the diameter was not substantially changed.

The average and the standard deviation of each etching rate of the 90 silicon nitride films 32 and the 90 silicon oxide films 33 were calculated, and whether the relative etching rate in the in-plane direction (the direction parallel with the surface of the film) of the film changed with the position in the stacking direction of the films and the uniformity of the relative etching rate were evaluated. The presence of deposits adhering to the side wall (inner face) of the through-hole 34 was also determined. The results are shown in Table 2.

is thought to be that a higher partial pressure of nitrosyl fluoride in the chamber increased the contact frequency of the surface of the silicon nitride film with nitrosyl fluoride to smoothly promote etching and that controlling temperature suppressed the generation of particles arising from wear or the like of the chamber.

The results of Examples 2 and 4 reveal that at a higher internal pressure of the chamber, silicon nitride is etched at a higher rate. The results suggest a higher partial pressure of nitrosyl fluoride in a chamber increases the etching rate.

The results of Examples 5, 6, and 7 reveal that at a higher stage temperature, silicon nitride is etched at a higher rate. At a stage temperature of 50° C., the etching rate of silicon nitride decreases, and thus to improve the process throughput, the etching temperature is preferably 50° C. or more.

TABLE 2

| | Etching gas | | | Stage | Pressure | | Average | Standard | |
|---|---|---|---|---|---|---|---|---|---|
| | Com- position | Flow rate*) | NOF content (% by volume) | temper- ature (° C.) | in chamber (kPa) | | of etching rate (nm/min) | deviation of etching rate (nm/min) | Deposits |
| Ex. 9 | NOF/Ar | 35/65 | 35.0 | 150 | 6.7 | Amorphous carbon | less than 0.1 | less than 0.1 | Not observed |
| | | | | | | Silicon nitride | 10 | 2 | |
| | | | | | | Silicon oxide | less than 0.1 | less than 0.1 | |
| Ex. 10 | NOF/Ar | 65/35 | 65.0 | 150 | 6.7 | Amorphous carbon | less than 0.1 | less than 0.1 | Not observed |
| | | | | | | Silicon nitride | 15 | 3 | |
| | | | | | | Silicon oxide | less than 0.1 | less than 0.1 | |
| Ex. 11 | NOF/Ar | 65/35 | 65.0 | 200 | 6.7 | Amorphous carbon | less than 0.1 | less than 0.1 | Not observed |
| | | | | | | Silicon nitride | 29 | 5 | |
| | | | | | | Silicon oxide | less than 0.1 | less than 0.1 | |
| Comp. Ex. 3 | NOF/Ar | 10/90 | 10.0 | 150 | 6.7 | Amorphous carbon | less than 0.1 | less than 0.1 | Observed |
| | | | | | | Silicon nitride | 1 | less than 0.1 | |
| | | | | | | Silicon oxide | 0.2 | less than 0.1 | |
| Comp. Ex. 4 | NOF/Ar | 10/90 | 10.0 | 350 | 6.7 | Amorphous carbon | 1 | less than 0.1 | Observed |
| | | | | | | Silicon nitride | 5 | 4 | |
| | | | | | | Silicon oxide | less than 0.1 | less than 0.1 | |

*)The flow rate of nitrosyl fluoride (NOF) gas and a dilution gas (Ar): for example, expressed as 35/65 when the flow rate of nitrosyl fluoride gas is 35 L/min and the flow rate of a dilution gas is 65 mL/min.

Examples 10 and 11

A member to be etched was etched in the same manner as in Example 9 except that the flow rates of nitrosyl fluoride gas and argon and the stage temperature were set as shown in Table 2, and the average and the standard deviation of each etching rate of silicon nitride and silicon oxide were calculated. In the same manner as in Example 9, the presence of deposits adhering to the side wall of the through-hole 34 was also determined. The results are shown in Table 2.

Comparative Examples 3 and 4

A member to be etched was etched in the same manner as in Example 9 except that the flow rates of nitrosyl fluoride gas and argon and the stage temperature were set as shown in Table 2 and the etching gas was allowed to flow for 30 minutes, and the average and the standard deviation of each etching rate of silicon nitride and silicon oxide were calculated. In the same manner as in Example 9, the presence of deposits adhering to the side wall of the through-hole 34 was also determined. The results are shown in Table 2.

From the results of Examples 1 to 3, as the etching gas contained nitrosyl fluoride at a higher proportion, the etching rate of silicon nitride and the etching selectivity to the non-etching object increased. Onto each surface of the silicon nitride film, the silicon oxide film, and the amorphous carbon film on the silicon wafer after completion of the etching, almost no particles adhered. The reason for this The results of Examples 1, 2, 3, and 8 reveal that at a higher partial pressure of nitrosyl fluoride in the etching gas, the number of generated particles tends to slightly increase, but this is not at a problematic level.

The result of Comparative Example 2 reveals that at a lower partial pressure of nitrosyl fluoride in the etching gas, the etching rate of silicon nitride and the etching selectivity of silicon nitride to silicon oxide deteriorate. In contrast, in Comparative Example 1 in which the etching temperature was increased to increase the etching rate of silicon nitride, the generation of particles markedly increased.

The results of Examples 9, 10, and 11 reveal that at a higher stage temperature or a higher partial pressure of nitrosyl fluoride, silicon nitride is etched at a higher rate. The ratio of the standard deviation of the etching rate to the average of the etching rate of silicon nitride was about 17 to 208, and the 90 silicon nitride films 32 were etched substantially uniformly independent of the position in the stacking direction of the silicon nitride films 32.

Meanwhile, the result of Comparative Example 3 reveals that at a low nitrosyl fluoride concentration in the etching gas and at a low etching temperature, the etching rate of silicon nitride and the ratio of the etching rate of silicon nitride to the etching rate of silicon oxide markedly decreased. In Comparative Example 3, deposits adhering to the side wall of the through-hole 34 were observed.

The result of Comparative Example 4 reveals that at an excessively high etching temperature, the ratio of the standard deviation of the etching rate to the average of the etching rate of silicon nitride was about 80%. Specifically, of the 90 silicon nitride films 32, films close to the bottom of the through-hole 34 tend to be etched at a low rate, and a silicon nitride film 32 closer to the bottom of the through-hole 34 tends to be etched at a lower rate. Deposits adhering to the side wall of the through-hole 34 were observed.

As described above, by using characteristics of preventing deposited substances (deposits) from staying in a structural body after etching and of promoting etching silicon nitride films substantially uniformly independent of the position in the stacking direction, a structure in which ends of the silicon oxide films protrude to the through-hole can be formed, for example. Such a structure is used, for example, as the structural body of a semiconductor element such as a 3D-NAND flash memory. In other words, the present invention has a technical importance of usable, for example, to produce a semiconductor element such as a 3D-NAND flash memory.

REFERENCE SIGNS LIST

1 nitrosyl fluoride gas supply unit
2 dilution gas supply unit
3 nitrosyl fluoride gas flow controller
4 dilution gas flow controller
5 nitrosyl fluoride gas supply pipe
6 dilution gas supply pipe
7 nitrosyl fluoride gas pressure controller
8 dilution gas pressure controller
10 chamber
11 stage
12 member to be etched
13 exhaust pipe
14 thermometer
15 vacuum pump
16 pressure gauge
31 silicon substrate
32 silicon nitride film
33 silicon oxide film
34 through-hole
35 amorphous carbon film

The invention claimed is:

1. An etching method comprising:

an etching step of bringing an etching gas containing 30% or more by volume of nitrosyl fluoride into contact with a member to be etched having an etching object that is to be etched by the etching gas and having a non-etching object that is not to be etched by the etching gas, to selectively etch the etching object as compared with the non-etching object without plasma, wherein, the etching object contains silicon nitride, and the etching gas is a gas exclusively containing nitrosyl fluoride or a mixed gas containing nitrosyl fluoride and a dilution gas.

2. The etching method according to claim 1, wherein the non-etching object is at least one of silicon oxide and amorphous carbon.

3. The etching method according to claim 2, wherein in the etching step, a temperature condition is 50° C. or more and 250° C. or less.

4. The etching method according to claim 1, wherein an etching selectivity that is a ratio of an etching rate of the etching object to an etching rate of the non-etching object is 10 or more.

5. A method for producing a semiconductor element, the method using the etching method according to claim 1 to produce a semiconductor element, wherein, the member to be etched is a semiconductor substrate having the etching object and the non-etching object, and the method comprises a processing step of removing at least a part of the etching object from the semiconductor substrate by the etching.

6. The etching method according to claim 2, wherein an etching selectivity that is a ratio of an etching rate of the etching object to an etching rate of the non-etching object is 10 or more.

7. The etching method according to claim 3, wherein an etching selectivity that is a ratio of an etching rate of the etching object to an etching rate of the non-etching object is 10 or more.

8. A method for producing a semiconductor element, the method using the etching method according to claim 2 to produce a semiconductor element, wherein, the member to be etched is a semiconductor substrate having the etching object and the non-etching object, and the method comprises a processing step of removing at least a part of the etching object from the semiconductor substrate by the etching.

9. A method for producing a semiconductor element, the method using the etching method according to claim 3 to produce a semiconductor element, wherein, the member to be etched is a semiconductor substrate having the etching object and the non-etching object, and the method comprises a processing step of removing at least a part of the etching object from the semiconductor substrate by the etching.

10. A method for producing a semiconductor element, the method using the etching method according to claim 4 to produce a semiconductor element, wherein, the member to be etched is a semiconductor substrate having the etching object and the non-etching object, and the method comprises a processing step of removing at least a part of the etching object from the semiconductor substrate by the etching.

11. The etching method according to claim 1, wherein the etching gas contains nitrosyl fluoride at 33.3% by volume or more.

* * * * *